United States Patent
Takeda

(10) Patent No.: US 12,135,295 B2
(45) Date of Patent: Nov. 5, 2024

(54) INSPECTION APPARATUS AND FOCAL POSITION ADJUSTMENT METHOD

(71) Applicant: NuFlare Technology, Inc., Yokohama (JP)

(72) Inventor: Masaya Takeda, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 112 days.

(21) Appl. No.: 18/049,748

(22) Filed: Oct. 26, 2022

(65) Prior Publication Data

US 2023/0137226 A1 May 4, 2023

(30) Foreign Application Priority Data

Oct. 29, 2021 (JP) .................................. 2021-177889

(51) Int. Cl.
*G02B 7/28* (2021.01)
*G01N 21/95* (2006.01)

(52) U.S. Cl.
CPC . *G01N 21/9501* (2013.01); *G01N 2201/0636* (2013.01); *G01N 2201/105* (2013.01)

(58) Field of Classification Search
CPC ....... G01N 21/9501; G01N 2201/0636; G01N 2201/105; G01N 2021/95676; G01N 21/95607; G03F 1/84; G03F 7/70641; G02B 7/28; G02B 21/06; G06T 7/00
See application file for complete search history.

(56) References Cited

U.S. PATENT DOCUMENTS

| | | | |
|---|---|---|---|
| 7,940,385 B2* | 5/2011 | Hamamatsu | G01N 21/9501 356/237.4 |
| 2001/0019100 A1* | 9/2001 | Ogura | G02B 7/28 250/201.2 |
| 2014/0111636 A1* | 4/2014 | Inoue | G01N 21/95607 348/92 |

(Continued)

FOREIGN PATENT DOCUMENTS

| | | |
|---|---|---|
| JP | 7-86135 A | 3/1995 |
| JP | 2002-44392 A | 2/2002 |

(Continued)

OTHER PUBLICATIONS

Japanese Office Action mailed on Aug. 27, 2024, issued in Japanese Patent Application No. JP 2021-177889, with machine-generated English Translation, total 6 pages (citing documents 1-2, 11-17, therein).

*Primary Examiner* — Abdullahi Nur
(74) *Attorney, Agent, or Firm* — Oblon, McClelland, Maier & Neustadt, L.L.P.

(57) ABSTRACT

According to an embodiment, an inspection apparatus includes: a stage; an illumination optical system; an imaging optical system including a sensor that detects a focal position; a detection circuit configured to detect a focal position signal of the light; a setting circuit configured to set a first focus offset value of a first region based on a result obtained by shifting, in an advancement direction of the stage, coordinate data of first focal position data generated based on a result obtained by optically scanning the first region; and a control circuit configured to control a height position of the stage based on the focal position signal and the first focus offset value.

13 Claims, 8 Drawing Sheets

(56) References Cited

U.S. PATENT DOCUMENTS

| | | | |
|---|---|---|---|
| 2014/0160267 A1* | 6/2014 | Kawakami | G02B 21/365 |
| | | | 348/79 |
| 2016/0142617 A1* | 5/2016 | Oishi | G02B 21/245 |
| | | | 348/350 |
| 2017/0090176 A1* | 3/2017 | Pospiech | G02B 21/082 |
| 2017/0205614 A1* | 7/2017 | Nakano | G02B 7/36 |
| 2017/0206433 A1* | 7/2017 | Ogawa | H04N 23/56 |
| 2018/0059552 A1* | 3/2018 | Pandey | G03F 7/70191 |
| 2018/0188188 A1* | 7/2018 | Zhao | G01N 21/9501 |
| 2019/0137869 A1 | 5/2019 | Tang et al. | |
| 2019/0244844 A1* | 8/2019 | Takeda | H04N 23/56 |
| 2021/0297600 A1 | 9/2021 | Mantiply et al. | |

FOREIGN PATENT DOCUMENTS

| | | |
|---|---|---|
| JP | 2003-177101 A | 6/2003 |
| JP | 2008-112178 A | 5/2008 |
| JP | 2010-217317 A | 9/2010 |
| JP | 2012-237687 A | 12/2012 |
| JP | 2019-20274 A | 2/2019 |
| JP | 2021-128119 | 9/2021 |

* cited by examiner

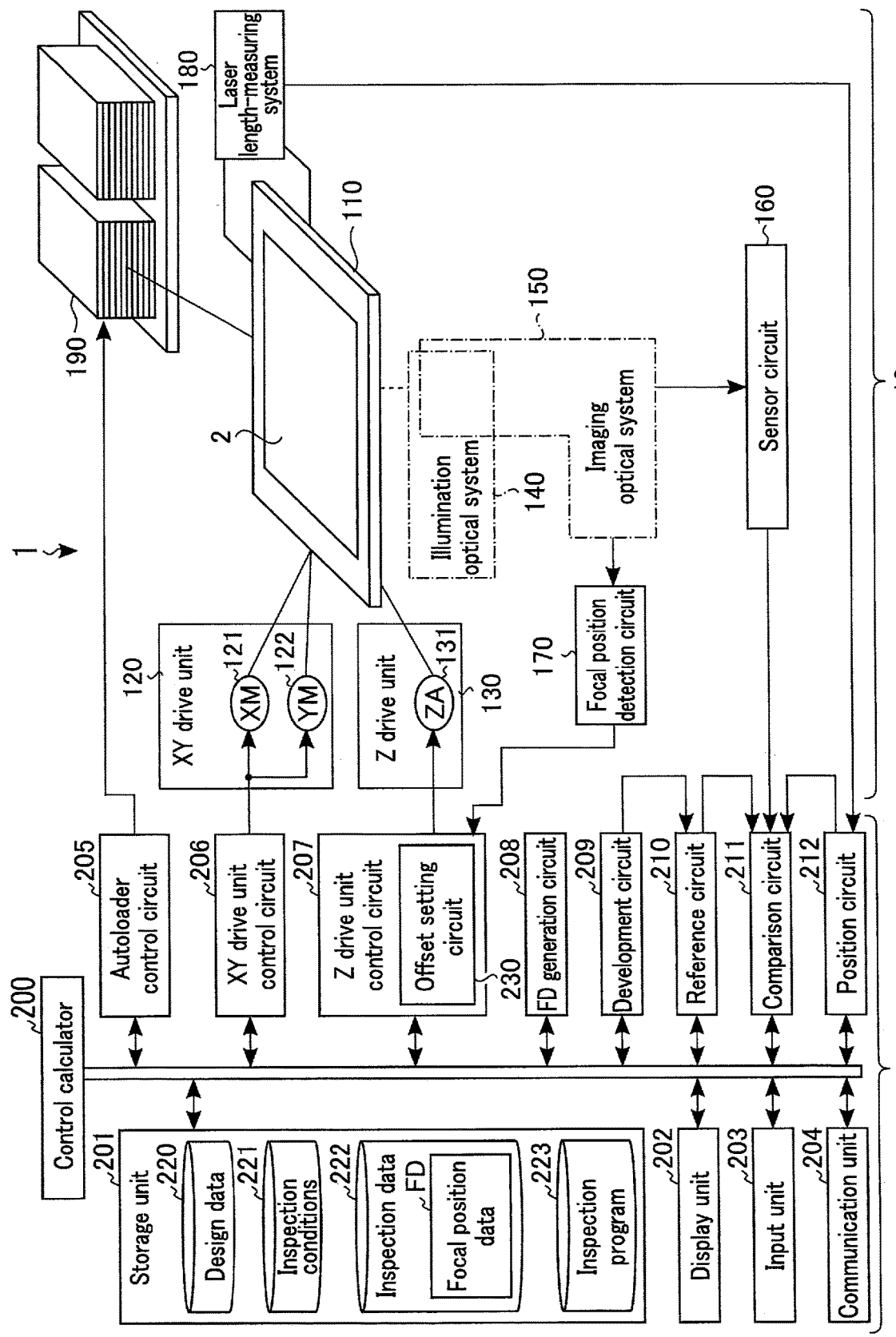
F I G. 1

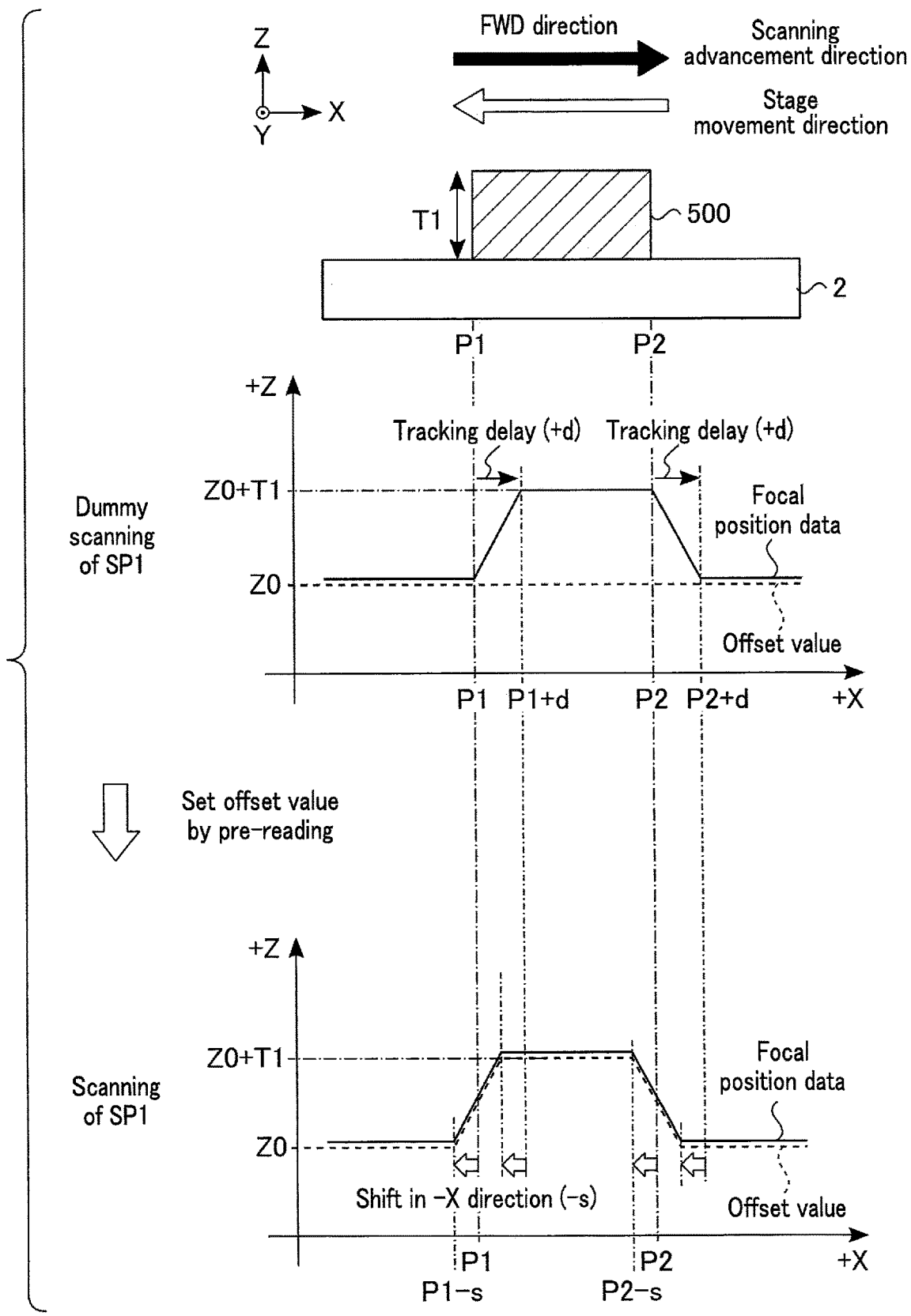
F I G. 7

INSPECTION APPARATUS AND FOCAL POSITION ADJUSTMENT METHOD

CROSS-REFERENCE TO RELATED APPLICATION

This application is based upon and claims the benefit of priority from Japanese Patent Application No. 2021-177889, filed Oct. 29, 2021, the entire contents of which are incorporated herein by reference.

FIELD

Embodiments described herein relate generally to an inspection apparatus and a focal position adjustment method for inspecting a pattern formed on a sample.

BACKGROUND

In a manufacturing process of a semiconductor device, a circuit pattern is transferred onto a semiconductor substrate by means of reduction exposure with an exposure apparatus (also referred to as a "stepper" or a "scanner"). In such an exposure apparatus, a mask (also referred to as a "reticle") on which an original pattern (hereinafter also simply referred to as a "pattern") is formed is used.

One of the causes of reduced yields in manufacturing of semiconductor devices is defects in the mask pattern.

In most-advanced devices, it is required, for example, to form a pattern with a line width of several nanometers. With the miniaturization of the pattern, defects in the mask pattern are also miniaturized. Accordingly, a mask inspection apparatus with enhanced precision for detection of minute defects has been demanded.

In a mask inspection apparatus, a mask is placed on a stage. The stage moves, and thereby light with which the stage is irradiated via an optical system scans the mask. Light that has transmitted through or been reflected from the mask is caused by a lens to form an image on a sensor. Thereby, an optical image is acquired.

To capture an optical image with a fine pattern, development has been made to increase the magnification and the numerical aperture (NA) of the optical system of the inspection apparatus. This causes the optical system to have a shallow depth of focus for the mask. With the shallow depth of focus, a slight change in the distance between the optical system and the mask causes defocusing of light. This results in blurring of the pattern image in the optical image, adversely affecting the optical image acquisition and the defect detection processing. An inspection apparatus with a real-time autofocus mechanism for suppressing defocusing is known.

For example, Patent Document 1 (Jpn. Pat. Appln. KOKAI Publication No. 2010-217317) discloses a method in which focal position information of an inspection region is subjected to computation processing using a polynomial approximation, and focal position control of an adjacent inspection region is performed based on results of the computation. Enhancing the speed of movement of the stage during optical scanning for enhancing the inspection speed may cause a delay in autofocus tracking, possibly causing defocusing in the presence of an abrupt step height.

The present invention has been made in view of the above-described circumstances. That is, the present invention aims to provide an inspection apparatus and a focal position adjustment method capable of decreasing an autofocus tracking delay.

SUMMARY

According to a first aspect, an inspection apparatus includes: a stage on which a sample is placed; an illumination optical system configured to irradiate the sample with light used for optical scanning of the sample; an imaging optical system including a sensor that detects a focal position, and configured to cause the light with which the sample is irradiated to form an image on the sensor; a detection circuit configured to detect a focal position signal of the light received by the sensor; a setting circuit configured to set a first focus offset value of a first region based on a result obtained by shifting, in an advancement direction of the stage, coordinate data of first focal position data generated based on a result obtained by optically scanning the first region, the first region being included in a plurality of stripe-shaped regions into which the sample is virtually divided in a direction orthogonal to the advancement direction of the stage; and a control circuit configured to control a height position of the stage based on the focal position signal and the first focus offset value.

According to a second aspect, a focal position adjustment method includes: optically scanning, in a first direction, a first region included in a plurality of stripe-shaped regions into which a sample is virtually divided in a direction orthogonal to an advancement direction of a stage on which the sample is placed; generating first focal position data based on a result obtained by optically scanning the first region; setting a first focus offset value of the first region based on a result obtained by shifting coordinate data of the first focal position data in the advancement direction of the stage; and optically scanning the first region by controlling a height position of the stage based on the first focus offset value and a focal position detection result.

BRIEF DESCRIPTION OF THE DRAWINGS

FIG. 1 is a diagram showing an overall configuration of an inspection apparatus according to an embodiment.

FIG. 7 is a diagram showing an example of pre-reading of focal position data in scanning of a stripe in a FWD direction in the inspection apparatus according to the embodiment.

DETAILED DESCRIPTION

Figure 2:
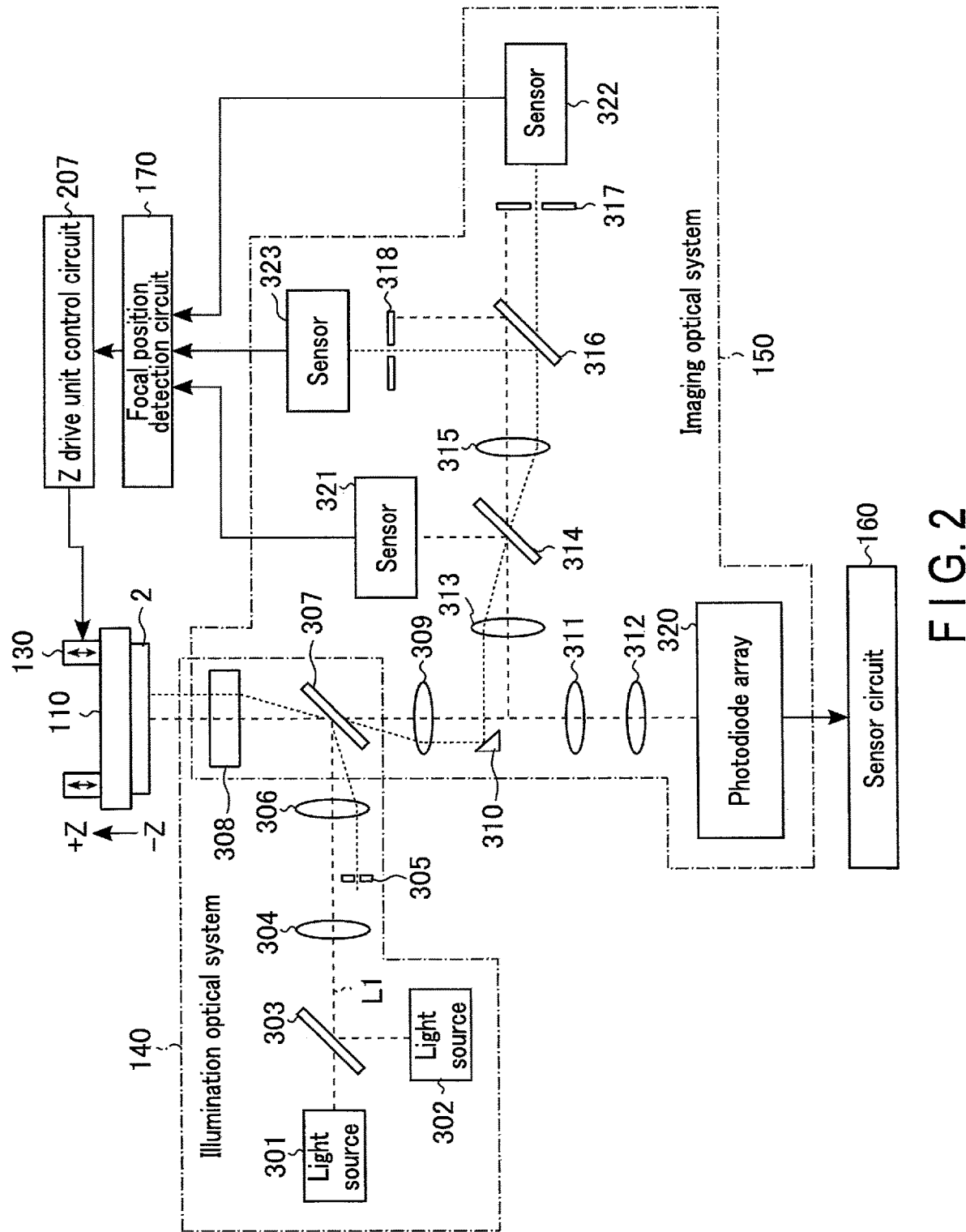
FIG. 2 is a block diagram of an illumination optical system 140 and an imaging optical system 150 of the inspection apparatus according to the embodiment.

Hereinafter, embodiments will be described with reference to the drawings. Each embodiment illustrates an apparatus and a method for embodying the technical idea of the invention. The drawings are either schematic or conceptual, and the dimensions, ratios, etc. of each drawing are not necessarily identical to the actual ones. The technical idea of the present invention is not designated by the shape, structure, arrangement, etc. of the components.

Hereinafter, a mask inspection apparatus will be described as an example of a sample inspection apparatus. In the present embodiment, a case will be described where an inspection apparatus captures an optical image; however, the configuration is not limited thereto. The inspection apparatus may capture an electron-beam image as an inspection image using, for example, a scanning electron microscope (SEM).

Moreover, in the present embodiment, a case will be described where a sample to be inspected is a mask used in photolithography, etc.; however, the configuration is not limited thereto. It may be any sample with a pattern provided on the surface, such as a template used in nanoimprint lithography (NIL), a wafer (semiconductor substrate), etc.

Furthermore, in the present embodiment, a die-to-database (D-DB) mode, in which an inspection image is compared with a reference image that is based on design data, will be described as a mask defect inspection mode in the inspection apparatus; however, the configuration is not limited thereto. The defect inspection mode may be a die-to-die (D-D) mode, in which an inspection image is compared with images of a plurality of regions with an identical pattern formed on the mask.

Furthermore, the focal position adjustment method described in the embodiment is not limited to an inspection apparatus, and may be applied to, for example, other apparatuses such as a charged particle beam irradiation apparatus used for producing a mask.

1. Overall Configuration of Inspection Apparatus

First, an example of an overall configuration of an inspection apparatus 1 will be described with reference to FIG. 1. FIG. 1 is a diagram showing an overall configuration of the inspection apparatus 1. The example of FIG. 1 shows a configuration in which an optical image is acquired using light (hereinafter also referred to as "reflected light") reflected from a mask 2; however, the configuration of the inspection apparatus 1 is not limited thereto. The inspection apparatus 1 may be configured to acquire an optical image using light that has transmitted through the mask 2 (hereinafter also referred to as "transmitted light"). Alternatively, the inspection apparatus 1 may be configured to acquire both an optical image using reflected light and an optical image using transmitted light.

As shown in FIG. 1, the inspection apparatus 1 includes an image acquisition mechanism 10 and a control mechanism 20. The inspection apparatus 1 according to the present embodiment includes an autofocus mechanism.

The image acquisition mechanism 10 includes a stage 110, an XY drive unit 120, a Z drive unit 130, an illumination optical system 140, an imaging optical system 150, a sensor circuit 160, a focal position detection circuit 170, a laser length-measuring system 180, and an autoloader 190.

The stage 110 is movable in an X direction that is parallel to a surface of the stage 110, a Y direction that is parallel to the surface of the stage 110 and that intersects the X direction, and a Z direction that is perpendicular to the surface of the stage 110. The mask 2 is placed on the stage 110.

The XY drive unit 120 includes a drive mechanism for allowing the stage 110 to move in an XY plane configured of the X and Y directions. More specifically, the XY drive unit 120 includes an X-axis motor 121 that drives the stage 110 in the X direction and a Y-axis motor 122 that drives the stage 110 in the Y direction. A stepping motor, for example, may be used as each of the X-axis motor 121 and the Y-axis motor 122. The XY drive unit 120 may include, for example, a rotation axis motor that rotates the stage 110 around a rotation axis on the XY plane, with the Z direction being the rotation axis.

An inspection region of the mask 2 is virtually divided into, for example, a plurality of stripe-shaped portions as viewed in the Y direction. Hereinafter, each of the portions into which the inspection region is divided will be referred to as a "stripe". The XY drive unit 120 controls the operation of the stage 110 in such a manner that each of the divisional stripes are optically scanned continuously.

The Z drive unit 130 includes a drive mechanism for moving the stage 110 in the Z direction. More specifically, the Z drive unit 130 includes, for example, a plurality of Z-axis actuators 131 which drive the stage 110 in the Z direction. For the Z-axis actuators 131, actuators that use, for example, piezoelectric elements can be used.

The illumination optical system 140 includes a light source, and irradiates the mask 2 with illumination light emitted from the light source. Details of the illumination optical system will be described later.

The imaging optical system 150 causes reflected light from the mask 2 to form an image on a sensor. The imaging optical system 150 includes an optical image capturing sensor and a focal position measuring sensor. Details of the imaging optical system 150 will be described later.

The sensor circuit 160 subjects an electric signal received from the optical image capturing sensor in the imaging optical system 150 to an analogue-to-digital (A/D) conversion. The sensor circuit 160 transmits optical image data that is based on a digital signal obtained by the conversion to a comparison circuit 211 of the control mechanism 20. The optical image is based on a pattern of the mask 2. For the optical image, brightness (luminance) of each of the pixels into which the image capturing region is divided on the XY plane is expressed as a tone value. If, for example, the tone value is represented as 8-bit data, the pixel value of each pixel is represented as a tone value from 0 to 255.

The focal position detection circuit 170 detects a focal position (a deviation amount of a focal point) based on an electric signal (a focal position signal) received from the focal position measuring sensor in the imaging optical system 150. The focal position detection circuit 170 generates a focal position adjustment signal based on the detected focal position. The focal position adjustment signal is a signal for bringing the focal position of the illumination light into focus on a pattern surface of the mask 2. The focal position adjustment signal contains information on a correction amount of a Z coordinate of the stage 110. The focal position detection circuit 170 transmits the focal position adjustment signal to a Z drive unit control circuit 207. The focal position detection circuit 170 is included in the autofocus mechanism.

The laser length-measuring system 180 measures a position (also referred to as a "stage position") of the stage 110 in the X and Y directions. The laser length-measuring system 180 transmits information on the measured stage position in the XY plane to a position circuit 212 of the control mechanism 20.

A plurality of masks 2 are set on the autoloader 190. The autoloader 190 loads a mask 2 to be inspected onto the stage 110. The autoloader 190 unloads, from the stage 110, a mask 2 for which an optical image capturing has ended.

The control mechanism 20 includes a control calculator 200, a storage unit 201, a display unit 202, an input unit 203, a communication unit 204, an autoloader control circuit 205, an XY drive unit control circuit 206, the Z drive unit control circuit 207, an FD generation circuit 208, a development circuit 209, a reference circuit 210, the comparison circuit 211, and the position circuit 212. These are coupled to each other via, for example, a bus line.

The autoloader control circuit 205, the XY drive unit control circuit 206, the Z drive unit control circuit 207, the development circuit 209, the reference circuit 210, the comparison circuit 211, and the position circuit 212 may be configured of programs executed by the control calculator 200, configured of hardware or firmware included in the control calculator 200, or configured of individual circuits controlled by the control calculator 200. Hereinafter, a case will be described where the functions of these circuits are implemented based on programs executed by the control calculator 200.

The control calculator 200 controls the entirety of the inspection apparatus 1. More specifically, the control calculator 200 controls the image acquisition mechanism 10, the storage unit 201, the display unit 202, the input unit 203, the communication unit 204, the autoloader control circuit 205, the XY drive unit control circuit 206, the Z drive unit control circuit 207, the development circuit 209, the reference circuit 210, the comparison circuit 211, and the position circuit 212. The control calculator 200 acquires an optical image by controlling the image acquisition mechanism 10. Also, the control calculator 200 generates a reference image by controlling the control mechanism 20. The control calculator 200 compares the optical image with the reference image, and detects a defect, etc. in the pattern. The control calculator 200 includes, for example, an unillustrated central processing unit (CPU). The CPU executes, for example, an inspection program 223 in the storage unit 201. The control calculator 200 may be a CPU device such as a microprocessor, or a computer apparatus such as a personal computer. Also, at least some of the functions of the control calculator 200 may be served by other integrated circuits such as an application-specific integrated circuit (ASIC), a field-programmable gate array (FPGA), or a graphics processing unit (GPU).

The storage unit 201 stores information relating to inspection. More specifically, the storage unit 201 stores design data 220, inspection condition data 221, inspection data 222, an inspection program 223, etc. The storage unit 201 may include, as an external storage, various storage apparatuses such as a magnetic disk storage (a hard disk drive, HDD) or a solid-state drive (SSD).

The design data 220 is design data of the mask 2.

The inspection condition data 221 include parameters such as image capturing conditions and inspection conditions.

The inspection data 222 contains data relating to the reference image, the optical image, and the inspection results. Also, the inspection data 222 contains focal position data FD. The focal position data FD is data based on X, Y, and Z coordinates of the mask 2 (stage 110) during optical scanning of the mask 2.

The inspection program 223 is a program for executing a pattern inspection. The storage unit 201 stores the inspection program 223 as a non-transitory storage medium. The inspection program 223 is stored in, for example, a read-only memory (ROM).

The display unit 202 is a display apparatus such as a cathode ray tube (CRT) display, a liquid crystal display, or an organic electro luminescence (EL) display. The display unit 202 may include a speech output apparatus.

The input unit 203 is an input apparatus such as a keyboard, a mouse, a touch panel, or a button switch.

The communication unit 204 is an apparatus for connection to a network to perform data transmission and reception to and from an external apparatus. For such communications, various communication standards may be used. The communication unit 204 is configured, for example, to receive design data from an external apparatus, and transmits results of inspection to the external apparatus.

The autoloader control circuit 205 controls the operation of the autoloader 190. The autoloader control circuit 205 operates the autoloader 190 and loads the mask 2 to be inspected onto the stage 110. Also, the autoloader control circuit 205 operates the autoloader 190 and unloads the mask 2 from the stage 110.

The XY drive unit control circuit 206 controls the XY drive unit 120. For example, the XY drive unit control circuit 206 acquires results of position measurement (X and Y coordinates) of the stage 110 on the XY plane measured by the laser length-measuring system 180 via the position circuit 212, and controls the XY drive unit 120 based on the acquired results.

The Z drive unit control circuit 207 controls the Z drive unit 130. The Z drive unit control circuit 207 of the present embodiment determines the Z coordinate based on a focus offset value and the focal position adjustment signal (autofocus control signal). The focus offset value is a setting value (X, Y, and Z coordinates) of the position of the stage 110 used for scanning. The Z drive unit control circuit 207 is included in the autofocus mechanism.

The Z drive unit control circuit 207 includes an offset setting circuit 230. The offset setting circuit 230 sets the focus offset value based on the focal position data FD read from the storage unit 201. In the present embodiment, the offset setting circuit 230 sets the focus offset value using the focal position data FD at the time of scanning of a given stripe of the mask 2 in an identical direction. At this time, the offset setting circuit 230 sets the focus offset value by, for example, pre-reading information on the Z coordinate of the focal position data FD with respect to the movement direction of the stage 110. Details of the setting of the focus offset value will be described later.

The FD generation circuit 208 generates the focal position data FD based on the results of the scanning of the stripe. More specifically, the FD generation circuit 208 calculates approximation data by means of a moving average using, for example, data of continuous Z coordinates (height positions of the stage 110) during scanning of a single stripe. By associating, for example, the approximation data of the Z coordinate and the data of the X and Y coordinates, the FD generation circuit 208 generates the focal position data FD. The focal position data FD may further contain information on the stripe number, etc. The data of the X, Y, and Z coordinates may be results of measurements of the position of the stage 110 acquired from the position circuit 212, or may be information on control of the position of the stage 110 performed by the XY drive unit 120 and the Z drive unit 130. The FD generation circuit 208 transmits the focal position data FD to the storage unit 201.

The development circuit 209 develops (converts) the design data 220 into, for example, binary or multivalued image data. More specifically, the development circuit 209 develops, for example, the design data 220 stored in the storage unit 201 into data of each pattern (figure), and interprets a figure code indicating the figure shape of the figure data, figure dimensions, etc. The development circuit 209 develops the design data 220 into a binary or multivalued image (hereinafter referred to as an "development image") as a pattern arranged in a unit square of a grid of a predetermined quantization size. The development circuit 209 computes an occupancy indicating a rate at which the figure occupies pixel of the development image in each pixel. The computed figure occupancy in each pixel is the pixel value of the development image. If, for example, the pixel value of the development image is represented in an 8-bit tone value, the pixel value of each pixel is represented as a tone value from 0 to 255. The development circuit 209 transmits the generated development image to the reference circuit 210.

The reference circuit 210 generates a reference image using the development image. The reference circuit 210 transmits the generated reference image to the comparison circuit 211.

The comparison circuit 211 compares the optical image received from the sensor circuit 160 with the reference image received from the reference circuit 210 using an appropriate algorithm. The comparison circuit 211 determines, if the difference in the tone values of the optical image and the reference image exceeds a preset threshold value, that there is a defect at a corresponding coordinate position (X and Y coordinates) of the mask 2. The comparison circuit 211 stores the inspection data in the storage unit 201. The comparison circuit 211 may be configured to display the inspection data on the display unit 202, or output the inspection data to the outside via the communication unit 204.

The position circuit 212 generates position data of the stage 110 on the XY plane based on data received from the laser length-measuring system 180.

2. Configuration of Illumination Optical System and Imaging Optical System

Next, an example of a configuration of the illumination optical system 140 and the imaging optical system 150 will be described with reference to FIG. 2. FIG. 2 is a block diagram of the illumination optical system 140 and the imaging optical system 150.

A configuration of the illumination optical system 140 will be described.

As shown in FIG. 2, the illumination optical system 140 includes light sources 301 and 302, a dichroic mirror 303, a lens 304, a slit 305, a lens 306, a half mirror 307, and an objective lens 308.

The light sources 301 and 302 emit light with which the mask 2 is to be irradiated. The wavelengths of light emitted from the light sources 301 and 302 are different each other. The light may be emitted by either one of the light sources 301 and 302, or both of them at the same time. The light source 301 is used for capturing an optical image and detecting a focal position. Depending on the relationship between the wavelength of light from the light source 301 and the layout of the mask pattern, the precision in detection of the focal position may deteriorate by the effect of diffracted light of light reflected from the mask 2. In such a case, the light source 302 is used for detecting the focal position. A case has been described where two light sources are provided; however, only a single light source (e.g., the light source 301) may be provided, and in such a case, the dichroic mirror 303 need not be provided.

The dichroic mirror 303 is used as an optical isolation means for the light sources 301 and 302. The dichroic mirror 303 of the present embodiment allows light from the light source 301 to transmit therethrough, and reflects light from the light source 302. The dichroic mirror 303 may be configured to reflect the light from the light source 301, and to allow the light from the light source 302 to transmit therethrough.

The light that has transmitted through or been reflected from the dichroic mirror 303 propagates along an optical axis L1, and is made incident on the lens 304.

Part of the light that has passed through the lens 304 passes through the slit 305. The light that has passed through the slit 305 is used for detecting the focal position. The light that has passed through the lens 304 and the light that has passed through the slit 305 are made incident on the lens 306.

The light refracted by the lens 306 is made incident on the half mirror 307. Part of the light that is made incident on the half mirror 307 is reflected, and is made incident on the objective lens 308.

The objective lens 308 concentrates the light onto the pattern surface of the mask 2. At this time, the light that has passed through the slit 305 is concentrated on the outside of the optical image capturing region of the mask 2. The objective lens 308 may have a structure in which a plurality of lenses are arranged inside an optical column.

The stage 110 moves in the Z direction in such a manner that the light that has passed through the objective lens 308 is focused at a position on the pattern surface of the mask 2. In the description that follows, a direction away from the objective lens 308 and a direction approaching the objective lens 308 as viewed in the Z direction are respectively referred to as a "+Z direction" and a "−Z direction".

Next, a configuration of the imaging optical system 150 will be described. The imaging optical system 150 includes the objective lens 308, half mirrors 307, 314, and 316, lenses 309, 311 to 313, and 315, a mirror 310, slits 317 and 318, a photodiode array 320, and sensors 321 to 323. The lenses 313 and 315, the half mirrors 314 and 316, the slits 317 and 318, and the sensors 321 to 323 are included in the autofocus mechanism.

Part of the light that has been reflected from the mask 2 and passed through the objective lens 308 passes through the half mirror 307 and is made incident on the lens 309. The light that has refracted at the lens 309 becomes approximately parallel to the optical axis.

Part of the light that has passed through the lens 309 passes through the lenses 311 and 312. The lenses 311 and 312 cause the light to form an image on the photodiode array 320.

The photodiode array 320 is an optical image capturing sensor. The photodiode array 320 generates an electric signal by photoelectrically converting the light that has formed an image. The photodiode array 320 transmits an electric signal to the sensor circuit 160. More specifically, the photodiode array 320 includes an unillustrated image sensor. Examples of the image sensor that may be used include a line sensor in which a plurality of charge-coupled device (CCD) cameras functioning as image capturing devices are aligned in a line. Examples of the line sensor include a time delay integration (TDI) sensor. The TDI sensor captures, for example, images of the pattern of the mask 2 placed on the stage 110, which is moving continuously.

Part of the light that has passed through the lens 309 is reflected from the mirror 310 and is made incident on the lens 313. The light that has been reflected from the mirror 310 includes light that has passed through the slit 305 and been reflected from the mask 2. The mirror 310 may be a half mirror.

The light refracted by the lens 313 is made incident on the half mirror 314.

The light that has been reflected from the half mirror 314 is made incident on the sensor 321.

The sensor 321 is used for measuring the optical intensity distribution of the pupil of the illumination optical system 140, namely, the pupil of the objective lens 308, or a pupil at a position that is conjugate thereto. Based on the received light, the sensor 321 generates an electric signal, and transmits the generated electric signal to the focal position detection circuit 170. For the sensor 321, a CCD image sensor, which is a two-dimensional sensor, is used. If, for example, the effects of the diffracted light can be confirmed from the light intensity measured by the sensor 321, the light source 302 is used for detecting the focal position.

The light that has transmitted through the half mirror 314 passes through the lens 315, and is made incident on the half mirror 316.

The light that has transmitted through the half mirror 316 irradiates the slit 317. The light that has passed through the slit 317 is made incident on the sensor 322. The light that has been reflected from the half mirror 316 irradiates the slit 318. The light that has passed through the slit 318 is made incident on the sensor 323. The slits 317 and 318 are arranged to allow light that has passed through the slit 305 and been reflected from the mask 2 to pass therethrough. At this time, the slits 317 and 318 are arranged so as to be positioned at the front-side conjugate position and the rear-side conjugate position with respect to the mask 2. The slit 317 may be arranged on the front side and the slit 318 may be arranged on the rear side, or vice versa. It is preferable that the widths of the slits 317 and 318 correspond to half a spread light flux based on the numerical aperture (NA) of the objective lens 308, namely, half the pupil diameter of the objective lens 308.

The sensors 322 and 323 are sensors for detecting the focal position. Based on the received light, the sensors 322 and 323 generate an electric signal (a focal position signal), and transmit the generated electric signal to the focal position detection circuit 170. For the sensors 322 and 323, a photodiode or a photoelectron amplifier tube, for example, is used. The focal position detection circuit 170 calculates a focal position (a deviation amount from the focal position) by comparing the light amount at the front-side conjugate position and the light amount at the rear-side conjugate position. The position where the light amount at the front-side conjugate position and the light amount at the rear-side conjugate position are equal is the optimum focal position.

In the imaging optical system 150, the light from the light source 301 and the light from the light source 302 may be isolated, and the focal position may be detected from each of them. In this case, a dichroic mirror is provided, for example, between the half mirror 314 and the lens 315. The dichroic mirror allows, for example, the light from the light source 301 to transmit therethrough, and reflects the light from the light source 302. Also, two focal point detection systems each configured of the lens 315, the half mirror 316, the slits 317 and 318, and the sensors 322 and 323 may be provided in such a manner that the focal position is detected from each of the light that has transmitted through and the light that has been reflected from the dichroic mirror.

3. Inspection Region of Mask

Figure 3:
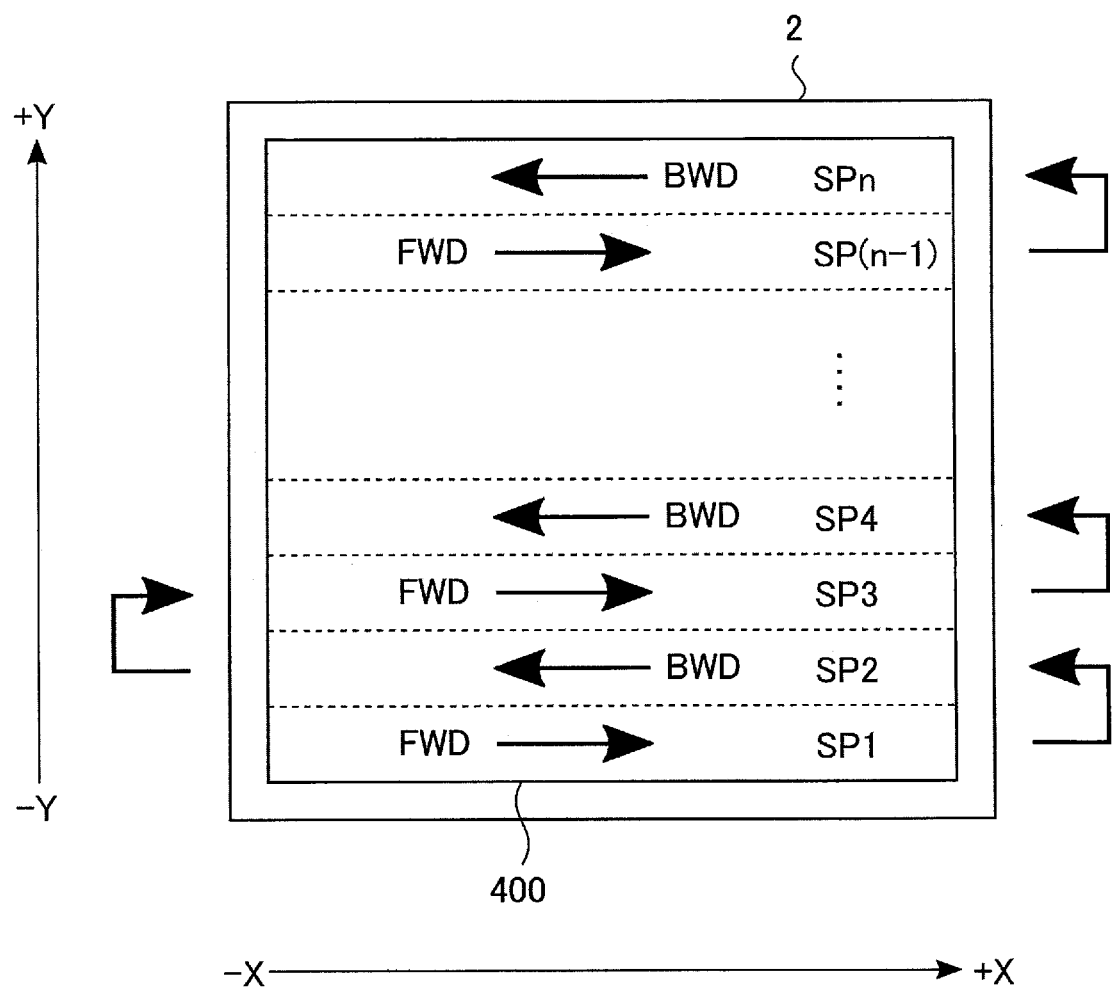
FIG. 3 is a diagram showing an example of an inspection region of a mask in an inspection apparatus according to the embodiment.

Next, an example of an inspection region of the mask 2 will be described with reference to FIG. 3. FIG. 3 is a diagram showing a surface of the mask 2. Hereinafter, a case will be described where the mask 2 is scanned in the X direction, and a plurality of stripes are aligned in the Y direction. A direction going toward the left side in FIG. 3 and a direction going toward the right side in FIG. 3 as viewed in the X direction will be respectively referred to as a "−X direction" and a "+X direction". Also, a direction going toward the bottom side in FIG. 3 and a direction going toward the top side in FIG. 3 as viewed in the Y direction will be respectively referred to as a "−Y direction" and a "+Y direction".

As shown in FIG. 3, the mask 2 includes an inspection region 400. In the inspection region 400, an unillustrated pattern is provided. The inspection region 400 is, for example, a transmission region of the mask 2, and an outer periphery of the inspection region 400 is a light-shielding region. In a reduction projection exposure apparatus, a pattern is exposed by light that has transmitted through the transmission region. Part of the light-shielding region may be included in the inspection region 400.

The inspection region 400 is virtually divided into a plurality of stripes SP as viewed in the Y direction. The stripe SP has a rectangular shape of a preset width. End portions of adjacent stripes SP in the Y direction may overlap one another. In the example of FIG. 3, the inspection region 400 is divided into n stripes SP1 to SPn (where n is a natural number equal to or greater than one). The stripes SP1 to SPn are arranged in this order toward the +Y direction. The XY drive unit 120 moves the stage 110 in such a manner that the stripes SP1 to SPn are scanned continuously.

More specifically, in the stripe SP1, the region irradiated with the light moves in the +X direction. Hereinafter, moving in the +X direction may also be referred to as moving in a "FWD direction". At this time, the stage 110 moves in the −X direction. Hereinafter, moving in the −X direction may also be referred to as moving in a "BWD direction". After scanning of the stripe SP1 ends, scanning of the stripe SP2 is executed. In the scanning of the stripe SP2, the irradiated region moves in the −X direction (BWD direction). At this time, the stage 110 moves in the +X direction (FWD direction). Subsequently, in the scanning of the stripe SP3, the irradiated region moves in the FWD direction. At this time, the stage 110 moves in the −X direction (BWD direction). Subsequently, in the scanning of the stripe SP4, the irradiated region moves in the BWD direction. At this time, the stage 110 moves in the +X direction (FWD direction). In this manner, scanning is executed until scanning of the stripe SPn ends, by allowing the movement direction of the irradiated region to alternate between the FWD direction and the BWD direction. That is, if the number of the stripes SP is odd, scanning is executed in the FWD direction, and if the number of the stripes SP is even, scanning is executed in the BWD direction.

4. Overall Flow of Inspection Process

Figure 4:
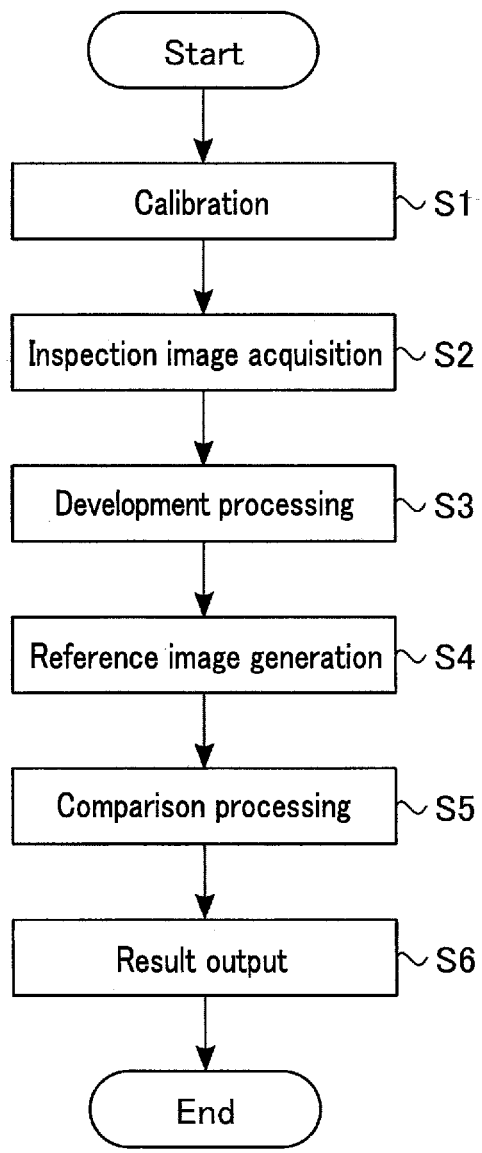
FIG. 4 is a flowchart of an inspection process in an inspection apparatus according to the embodiment.

Next, an example of an overall flow of an inspection process will be described with reference to FIG. 4. FIG. 4 is a flowchart of an inspection process.

As shown in FIG. 4, the control calculator 200 controls the image acquisition mechanism 10 to execute calibration (step S1). Through the calibration, a pixel value (tone value) of an optical image acquired by the sensor circuit 160 is adjusted.

Subsequently, the control calculator 200 executes scanning, and acquires an inspection image (optical image) of the mask 2 (step S2). The acquired optical image is transmitted to the comparison circuit 211.

The development circuit 209 executes development processing of design data 220 (step S3). More specifically, the development circuit 209 reads the design data 220 stored in the storage unit 201. The development circuit 209 develops (converts) the design data 220 into, for example, 8-bit image data (a development image). The development circuit 209 transmits the generated development image to the reference circuit 210.

The reference circuit 210 generates a reference image (step S4). The reference circuit 210 transmits the generated reference image to the comparison circuit 211. The acquisition of the inspection image and the generation of the reference image may be in reverse order, or may be performed at the same time.

The comparison circuit 211 performs comparison processing (step S5). More specifically, the comparison circuit 211 executes alignment between the optical image and the reference image, and performs positioning of a pattern in the optical image and a pattern in the reference image. Subsequently, the comparison circuit 211 compares the optical image with the reference image.

The comparison circuit 211 calculates a difference in pixel value (tone value) of each pixel, and determines that the pixel is defective if the difference in tone value is equal to or greater than a preset threshold value.

The control calculator 200 outputs a comparison result (inspection data) (step S6). The control calculator 200 saves the inspection results in the storage unit 201. The control calculator 200 may display the inspection results on the display unit 202, or may output them to an external apparatus (e.g., a review apparatus, etc.) via the communication unit 204.

5. Focal Position Adjustment

Next, focal position adjustment will be described. In the present embodiment, upon scanning, focal position adjustment (height position adjustment of the stage 110) is performed based on a focus offset value and an autofocus control signal. The focus offset value is set based on focal position data FD obtained by scanning a given stripe SP in an identical direction. More specifically, upon scanning of the stripe SPn, for example, the focus offset value is set based on focal position data FD (n−2) of a stripe SP (n−2) subjected to second-to-last scanning in the same direction. Accordingly, in the present embodiment, prior to scanning of the stripes SP1 and SP2, dummy scanning is executed in a direction corresponding to the scanning advancement direction of each stripe. In dummy scanning, the focal position data FD is acquired, and an optical image is not acquired. If, for example, the variable n is a numerical value less than n=1, which corresponds to the stripe SP1, namely, if n=−1 or n=0 is set, dummy scanning is executed.

5. 1. Flow of Optical Image Acquisition

Figure 5:
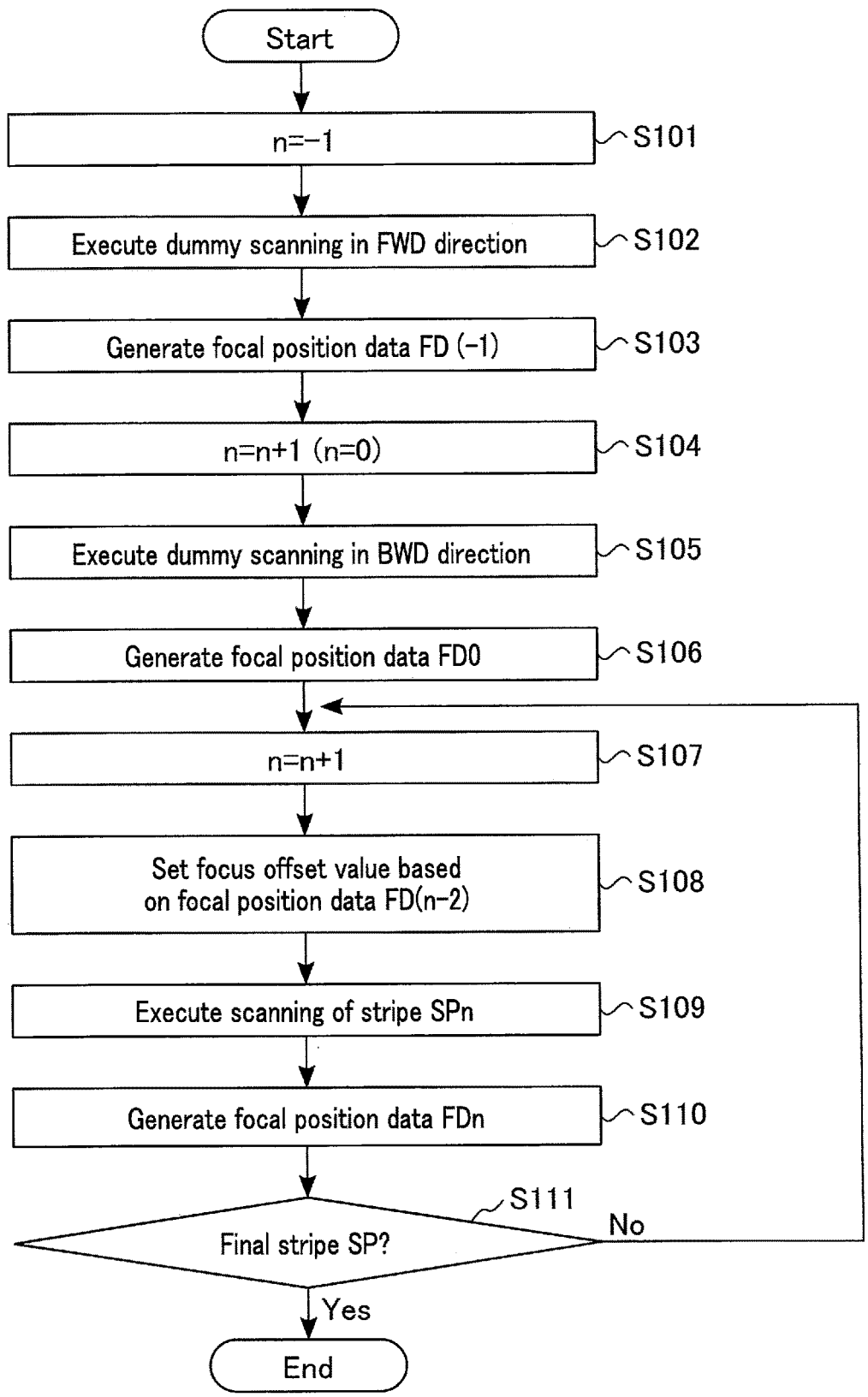
FIG. 5 is a flowchart showing a flow of optical image acquisition in an inspection apparatus according to the embodiment.

First, an example of a flow of optical image acquisition will be described with reference to FIG. 5, with a focus on scanning. FIG. 5 is a flowchart showing a flow of optical image acquisition.

As shown in FIG. 5, the control calculator 200 sets variable n=−1 (step S101). Subsequently, the control calculator 200 executes dummy scanning in the FWD direction (step S102). The dummy scanning in the FWD direction corresponds to the stripe SP1. For the dummy scanning in the FWD direction, for example, the stripe SP1 is used. At this time, an optical image of the stripe SP1 is not acquired.

Subsequently, the FD generation circuit 208 generates approximation data of the Z coordinate (height position of the stage 110) by means of a moving average based on the results of the scanning. The FD generation circuit 208 generates focal position data FD (−1) based on the approximation data of the Z coordinate (step S103). The focal position data FD (−1) is stored in the storage unit 201.

Subsequently, the control calculator 200 increments the variable n, to satisfy n=0 (step S104). Subsequently, the control calculator 200 executes dummy scanning in the BWD direction (step S105). The dummy scanning in the BWD direction corresponds to the stripe SP2. Accordingly, for the dummy scanning in the FWD direction, for example, the stripe SP2 is used.

Subsequently, the FD generation circuit 208 generates approximation data of the Z coordinate by means of a moving average based on the results of the scanning. The FD generation circuit 208 generates focal position data FD0 based on the approximation data of the Z coordinate (step S106). The focal position data FD0 is stored in the storage unit 201.

Subsequently, the control calculator 200 increments the variable n, to satisfy n=n+1 (step S107).

Subsequently, the offset setting circuit 230 reads focal position data FD (n−2) from the storage unit 201. The offset setting circuit 230 sets a focus offset value for the scanning of the stripe SPn based on the focal position data FD (n−2) (step S108). At this time, the offset setting circuit 230 pre-reads the focal position data FD. In other words, the offset setting circuit 230 shifts the data of the X coordinate of the focal position data FD in the advancement direction of the stage 110. More specifically, the stripe SP1 is scanned in, for example, the FWD direction. That is, the stage 110 moves in the −X direction. In such a case, the offset setting circuit 230 sets the focus offset value based on results obtained by shifting the coordinate data of the focal position data FD (−1), more specifically, the value of the X coordinate in the −X direction. The stripe SP2 is scanned in, for example, the BWD direction. That is, the stage 110 moves in the +X direction. In such a case, the offset setting circuit 230 sets the focus offset value based on results obtained by shifting the value of the X coordinate of the focal position data FD0 in the +X direction. The shift amount is determined based on a scanning speed and an autofocus tracking speed. Similarly, in the stripe SP3 and the stripes that follow (n=3 or greater), for example, the offset setting circuit 230 sets the focus offset value based on results obtained by shifting the focal position data FD of the stripe SP subjected to second-to-last scanning.

In the case of setting of the focus offset value, focal position data FD to which pre-reading is to be applied and focal position data FD to which pre-reading is not to be applied may coexist. For example, the offset setting circuit 230 may pre-read the focal position data FD (−1) and FD0 acquired by dummy scanning, and may not pre-read the focal position data FDn (n>1) acquired by scanning other than the dummy scanning.

In the present embodiment, a case has been described where the offset setting circuit 230 reads the focal position data FD (n−2) from the storage unit 201; however, the configuration is not limited thereto, as long as the scanning advancement direction is the same. If, for example, the stripe SP (n−4) is determined to be more similar to the pattern of the stripe SPn than the stripe SP (n−2) by referring to the design data 220, the offset setting circuit 230 may read the focal position data FD (n−4) from the storage unit 201.

Subsequently, the control calculator 200 executes scanning of the stripe SPn (step S109). At this time, the Z drive unit control circuit 207 controls a height position (Z coordinate) of the stage 110 based on the focus offset value and the focal position adjustment signal of the focal position detection circuit 170. Optical image data acquired by the scanning is transmitted to the comparison circuit 211.

Subsequently, the FD generation circuit 208 generates approximation data of the Z coordinate by means of a moving average based on the results of the scanning. The FD generation circuit 208 generates focal position data FDn based on approximation data of the Z coordinate (step S110). The focal position data FDn is stored in the storage unit 201.

The control calculator 200 confirms whether or not the stripe SPn subjected to the scanning is the final stripe SP (step S111). If the stripe SPn subjected to the scanning is not the final stripe SP (step S111 No), the control calculator 200 proceeds to step S107, and increments the variable n. On the other hand, if the stripe SPn subjected to the scanning is the final stripe SP (step S111_Yes), the control calculator 200 ends acquisition of the optical image.

5. 2. Concrete Example of Approximation Data of Z Coordinate

Figure 6:
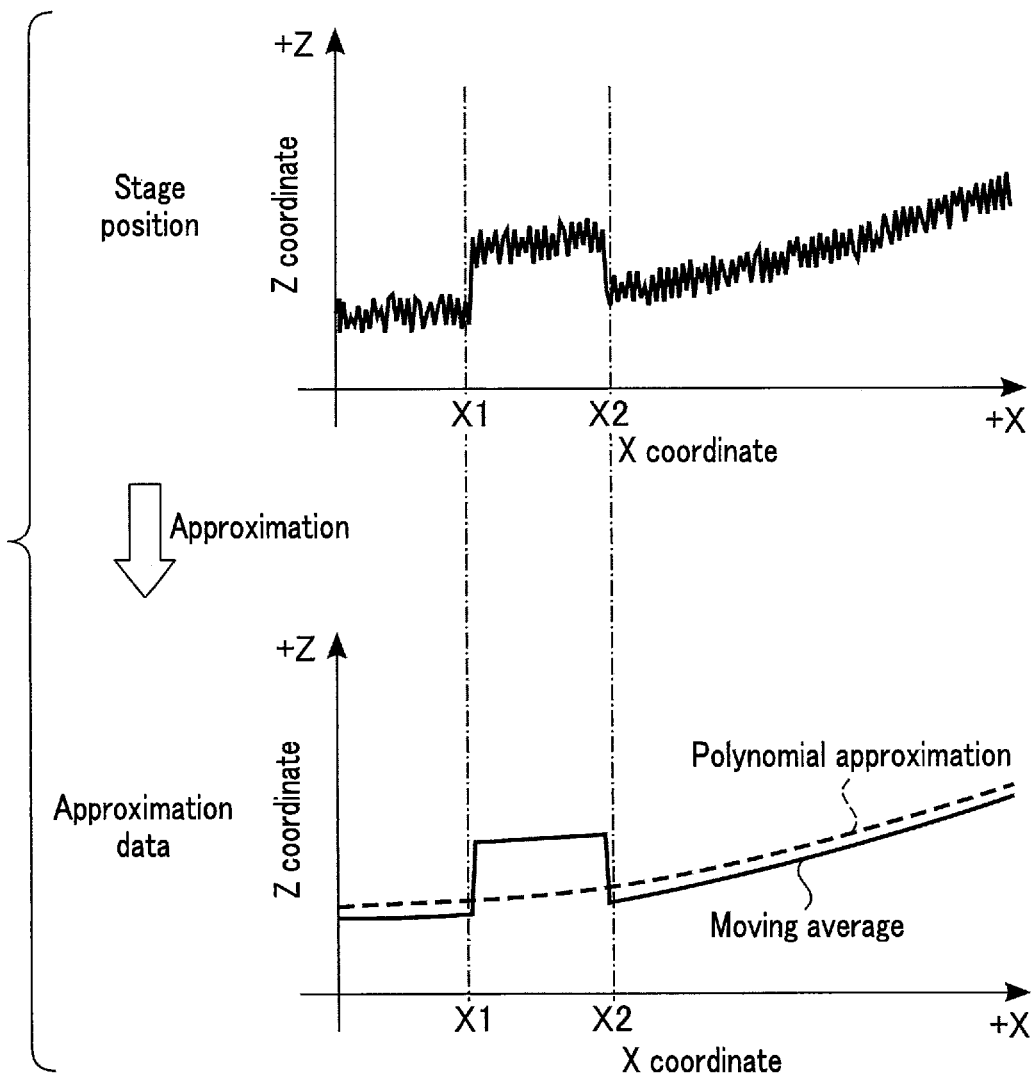
FIG. 6 is a diagram showing a concrete example of approximation data of a Z coordinate obtained by means of a moving average and a polynomial approximation.

Next, a concrete example of approximation data of a Z coordinate will be described with reference to FIG. 6. FIG. 6 is a diagram showing a concrete example of approximation data of a Z coordinate. In the example of FIG. 6, X and Z coordinates of the stage 110 in a single stripe SP are shown.

The graph at the top of FIG. 6 shows coordinates of the stage 110 during scanning. The overall rise of the Z coordinate toward the +X direction shows the effects of distortion of the mask 2. In the present example, an abrupt step height exists at coordinates X1 and X2.

The graph at the bottom shows two items of approximation data of the coordinates shown in the graph at the top, obtained by two types of computing. The approximation data shown by the solid line indicates the case where the FD generation circuit 208 of the present embodiment calculates approximation data by means of a moving average. The dashed line indicates the case where, as a comparative example, approximation data is calculated by means of a polynomial approximation. With the use of a polynomial approximation as in the comparative example, a step height between X1 and X2 may not be reflected if the order of the polynomial is small. On the other hand, with a moving average, it is possible to reflect a step height in the approximation data. In a moving average, the number of items of data used for calculating an average value of Z coordinates with respect to each X coordinate can be freely set. Such setting may be based on, for example, the noise of the Z coordinate.

5. 3. Concrete Example of Pre-Reading of Focal Position Data

Figure 8:
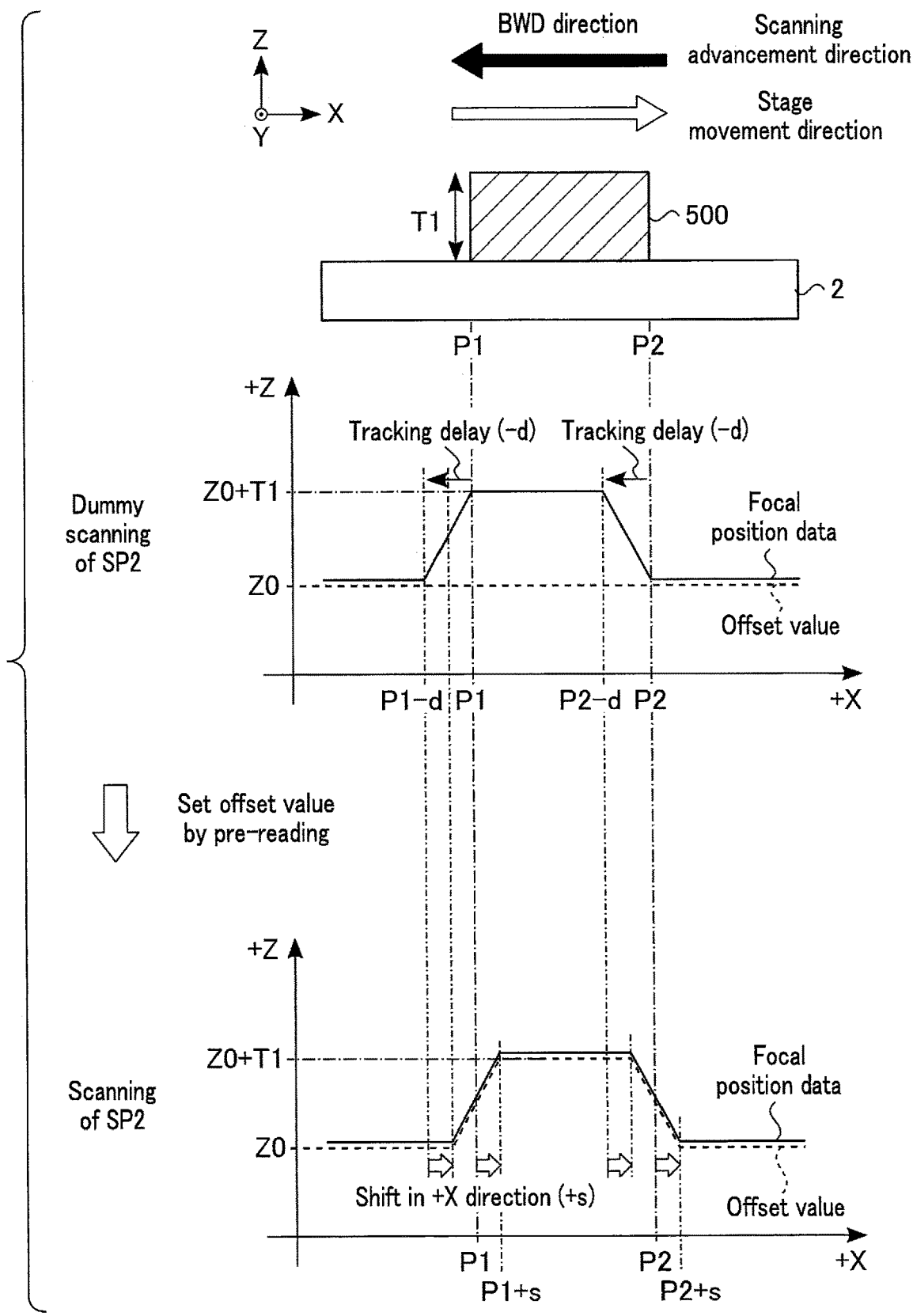
FIG. 8 is a diagram showing an example of pre-reading of focal position data in scanning of a stripe in a BWD direction in the inspection apparatus according to the embodiment.

Next, a concrete example of pre-reading of focal position data FD will be described with reference to FIGS. 7 and 8. FIG. 7 is a diagram showing an example of pre-reading of focal position data FD (−1) in scanning of the stripe SP1 in the FWD direction. FIG. 8 is a diagram showing an example of pre-reading of focal position data FD0 in scanning of the stripe SP2 in the BWD direction.

First, a case will be described where the stripe SP1 is scanned in the FWD direction.

The top of FIG. 7 shows part of a cross section of the mask 2 to be scanned. The graph at the middle shows a relationship between the Z coordinate and the X coordinate of the stage 110 based on dummy scanning of the stripe SP1. The graph at the bottom shows a relationship between the Z coordinate and the X coordinate of the stage 110 based on scanning of the stripe SP1.

A projection 500 (e.g., a pattern) with a height T1, for example, exists between the X coordinates P1 and P2 of the mask 2. Such a portion is subjected to dummy scanning in the FWD direction. That is, the stage 110 is moved in the −X direction. The focus offset value at this time is constantly Z0, regardless of the X coordinate. In the focal position data FD (−1), an autofocus tracking delay occurs in the +X direction, with respect to the actual X coordinate of the projection 500. More specifically, the Z coordinate of the surface of the mask 2 with respect to the X coordinate P1 fluctuates (rises) by +T1. On the other hand, in the focal position data FD (−1), as the X coordinate shifts from P1 to P1+d, the Z coordinate shifts from Z0 to Z0+T1. That is, an autofocus tracking delay of a magnitude |d| occurs in the +X direction. Similarly, the Z coordinate of the surface of the mask 2 with respect to the X coordinate P2 fluctuates (drops) by −T1. On the other hand, in the focal position data FD (−1), as the X coordinate shifts from P2 to P2+d, the Z coordinate shifts from Z0+T1 to Z0. That is, an autofocus tracking delay of a magnitude |d| occurs in the +X direction. Based on the above results, the focal position data FD (−1) is generated. Accordingly, the focal position data FD (−1) contains coordinate data in which the autofocus tracking delay has occurred.

The offset setting circuit 230 sets, prior to scanning the stripe SP1, a focus offset value used for scanning the stripe SP1, using the focal position data FD (−1) read from the storage unit 201. At this time, the offset setting circuit 230 pre-reads the focal position data FD (−1). More specifically, for scanning in the FWD direction, the offset setting circuit 230 causes the X-coordinate data to shift in the −X direction. Assuming, for example, that the magnitude of the shift amount is |s|, the offset setting circuit 230 sets data obtained by subtracting the X coordinate of the focal position data FD (−1) by |s| as the focus offset value. The shift amount |s| is a value equal to or smaller than the tracking delay amount |d|.

Thereby, in scanning of the stripe SP1, fluctuation of the Z coordinate can be started based on the focus offset value prior to fluctuation of the Z coordinate based on the autofocus control signal. For example, fluctuation of the Z coordinate starting from the coordinate P1 in dummy scanning starts from the coordinate P1−s in scanning. Accordingly, the autofocus tracking delay is decreased by the shift amount |s|.

Next, a case will be described where the stripe SP2 is scanned in the BWD direction.

The top of FIG. 8 shows part of a cross section of the mask 2 to be scanned. The graph at the middle shows a relationship between the Z coordinate and the X coordinate of the stage 110 based on dummy scanning of the stripe SP2. The graph at the bottom shows a relationship between the Z coordinate and the X coordinate of the stage 110 based on scanning of the stripe SP2.

In the example of FIG. 8, dummy scanning in the BWD direction is executed. That is, the stage 110 is moved in the +X direction. The focus offset value at this time is constantly Z0, regardless of the X coordinate. In the focal position data FD0, an autofocus tracking delay occurs in the −X direction, with respect to the actual X coordinate of the projection 500. More specifically, the Z coordinate of the surface of the mask 2 with respect to the X coordinate P2 fluctuates (rises) by +T1. On the other hand, in the focal position data FD0, as the X coordinate shifts from P2 to P2−d, the Z coordinate shifts from Z0 to Z0+T1. That is, an autofocus tracking delay of a magnitude |d| occurs in the −X direction. Similarly, the Z coordinate of the surface of the mask 2 with respect to the X coordinate P1 fluctuates (drops) by −T1. On the other hand, in the focal position data FD0, as the X coordinate shifts from P1 to P1−d, the Z coordinate shifts from Z0+T1 to Z0. That is, an autofocus tracking delay of a magnitude |d| occurs in the −X direction. Based on the above results, the focal position data FD0 is generated. Accordingly, the focal position data FD0 contains coordinate data in which the autofocus tracking delay has occurred.

Prior to scanning the stripe SP2, the offset setting circuit 230 sets the focus offset value used for scanning the stripe SP2 using the focal position data FD0 read from the storage unit 201. At this time, the offset setting circuit 230 pre-reads the focal position data FD0. More specifically, for scanning in the BWD direction, the offset setting circuit 230 shifts the X-coordinate data in the +X direction. The offset setting circuit 230 sets data obtained by adding |s| to the X-coordinate value of the focal position data FD0 as a focus offset value.

As a result, fluctuation of the Z coordinate, starting from the coordinate P2 in dummy scanning, starts from the coordinate P2+s in scanning. Accordingly, the tracking delay is decreased by the shift amount |s|.

6. Advantageous Effects of Present Embodiment

According to the configuration of the present embodiment, an inspection apparatus includes an FD generation circuit which calculates approximation data of the Z coordinate by means of a moving average based on results of scanning of a stripe SP and generates focal position data FD using the approximation data, and an offset setting circuit which sets a focus offset value by pre-reading (shifting) the focal position data in the advancement direction of the stage 110. By calculating approximation data by means of a moving average, the inspection apparatus is capable of calculating approximation data in which the effects of noise are reduced and information on an abrupt step height is reflected. Also, by pre-reading the focal position data and setting the focus offset value, the inspection apparatus is capable of starting moving of the height position of the stage 110 based on the focus offset value prior to moving of the height position of the stage 110 based on the autofocus control signal. It is thereby possible to decrease the tracking delay of the autofocus control signal. This decreases defocusing in an optical image, thus facilitating image capturing of a fine pattern and enhancing the precision of detecting pattern defects.

7. Others

While certain embodiments have been described, these embodiments have been presented by way of example only, and are not intended to limit the scope of the inventions. Indeed, the new embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inspection apparatus comprising:
a stage on which a sample is placed;
an illumination optical system configured to irradiate the sample with light used for optical scanning of the sample;
an imaging optical system including a sensor that detects a focal position, and configured to cause the light with which the sample is irradiated to form an image on the sensor;
a detection circuit configured to detect a focal position signal of the light received by the sensor;
a setting circuit configured to set a first focus offset value of a first region based on a result obtained by shifting, in an advancement direction of the stage, coordinate data of first focal position data generated based on a result obtained by optically scanning the first region, the first region being included in a plurality of stripe-shaped regions into which the sample is virtually divided in a direction orthogonal to the advancement direction of the stage; and
a control circuit configured to control a height position of the stage based on the focal position signal and the first focus offset value.

2. The inspection apparatus according to claim 1, wherein
in a case of optical scanning in a first direction, the stage moves in a second direction opposite to the first direction, and
the setting circuit is configured to set the first focus offset value of the first region based on a result obtained by shifting the coordinate data of the first focal position data in the second direction.

3. The inspection apparatus according to claim 1, further comprising:
a generation circuit configured to generate the first focal position data, and generate approximation data of the height position of the stage by means of a moving average based on a result obtained by optically scanning the sample.

4. The inspection apparatus according to claim 1, wherein
in a case of optical scanning of an n-th region (where n is a natural number equal to or greater than three) included in the stripe-shaped regions in a first direction, the setting circuit sets an n-th focus offset value based on a result obtained by optically scanning an (n−2)-th region included in the stripe-shaped regions in the first direction.

5. The inspection apparatus according to claim 1, wherein
the stripe-shaped regions include a second region adjacent to the first region, and
in a case of optical scanning of the first region in a first direction, the second region is optically scanned in a second direction opposite to the first direction.

6. The inspection apparatus according to claim 1, further comprising:
a comparison circuit configured to compare an optical image based on the optical scanning of the sample with a reference image.

7. The inspection apparatus according to claim 6, further comprising:
a reference circuit configured to generate the reference image based on design data of the sample.

8. The inspection apparatus according to claim 7, wherein the imaging optical system further includes a photodiode array that captures an image of the sample during the optical scanning.

9. A focal position adjustment method comprising:
   optically scanning, in a first direction, a first region included in a plurality of stripe-shaped regions into which a sample is virtually divided in a direction orthogonal to an advancement direction of a stage on which the sample is placed;
   generating first focal position data based on a result obtained by optically scanning the first region;
   setting a first focus offset value of the first region based on a result obtained by shifting coordinate data of the first focal position data in the advancement direction of the stage; and
   optically scanning the first region by controlling a height position of the stage based on the first focus offset value and a focal position detection result.

10. The focal position adjustment method according to claim 9, wherein
   the setting of the first focus offset value is performed based on a result obtained by shifting the first focal position data in a second direction opposite to the first direction.

11. The focal position adjustment method according to claim 9, wherein
   in the generation of the first focal position data, approximation data of the height position of the stage is generated by means of a moving average based on the result obtained by optically scanning the first region.

12. The focal position adjustment method according to claim 9, wherein
   in a case of optical scanning of an n-th region (where n is a natural number equal to or greater than three) included in the stripe-shaped regions in the first direction, an n-th focus offset value is set based on a result obtained by optically scanning, in the first direction, an (n−2)-th region included in the stripe-shaped regions.

13. The focal position adjustment method according to claim 9, further comprising:
   optically scanning a second region included in the stripe-shaped regions in a second direction opposite to the first direction;
   generating second focal position data based on a result obtained by optically scanning the second region; and
   setting a second focus offset value of the second region based on a result obtained by shifting coordinate data of the second focal position data in the advancement direction of the stage in the second region.

* * * * *